(12) United States Patent
Akita et al.

(10) Patent No.: US 7,973,322 B2
(45) Date of Patent: Jul. 5, 2011

(54) NITRIDE SEMICONDUCTOR LIGHT EMITTING DEVICE AND METHOD FOR FORMING THE SAME

(75) Inventors: Katsushi Akita, Itami (JP); Takashi Kyono, Itami (JP); Keiji Ishibashi, Itami (JP); Hitoshi Kasai, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 231 days.

(21) Appl. No.: 12/440,643

(22) PCT Filed: Apr. 17, 2008

(86) PCT No.: PCT/JP2008/057488
§ 371 (c)(1),
(2), (4) Date: Mar. 10, 2009

(87) PCT Pub. No.: WO2009/008202
PCT Pub. Date: Jan. 15, 2009

(65) Prior Publication Data
US 2010/0059759 A1    Mar. 11, 2010

(30) Foreign Application Priority Data
Jul. 11, 2007  (JP) ................................. 2007-182435

(51) Int. Cl.
*H01L 29/00* (2006.01)
*H01L 21/00* (2006.01)
(52) U.S. Cl. ........... 257/79; 267/E33.023; 267/E33.001; 438/46
(58) Field of Classification Search ...... 257/76, 257/94, E33.005, E33.023, 13, 79, E33.001; 438/47, 46, 33, 22, 460, 479
See application file for complete search history.

(56) References Cited

U.S. PATENT DOCUMENTS
6,468,882 B2 * 10/2002 Motoki et al. ................ 438/460
(Continued)

FOREIGN PATENT DOCUMENTS
| JP | 10-135576 | 5/1998 |
| JP | 2000-101140 | 4/2000 |
| JP | 2000-133883 | 5/2000 |
| JP | 2001-160656 | 6/2001 |
| JP | 2001-203384 | 7/2001 |

(Continued)

OTHER PUBLICATIONS

Sakai et al., "Defect structure in selective grown GaN films with low thread dislocation density", 1997, Appl. Phys. Lett., vol. 71, No. 16, pp. 2259-2261.*

(Continued)

*Primary Examiner* — Thomas L Dickey
*Assistant Examiner* — Nikolay Yushin
(74) *Attorney, Agent, or Firm* — Venable LLP; Michael A. Sartori; Steven J. Schwarz

(57) ABSTRACT

An active layer 17 is provided so as to emit light having a light emission wavelength in the range of 440 to 550 nm. A first conduction type gallium nitride-based semiconductor region 13, the active layer 17, and a second conduction type gallium nitride-based semiconductor region 15 are disposed in a predetermined axis Ax direction. The active layer 17 includes a well layer composed of hexagonal $In_XGa_{1-X}N$ ($0.16 \leq X \leq 0.35$, X: strained composition), and the indium composition X is represented by a strained composition. The a-plane of the hexagonal $In_XGa_{1-X}N$ is aligned in the predetermined axis Ax direction. The thickness of the well layer is in the range of more than 2.5 nm to 10 nm. When the thickness of the well layer is set to 2.5 nm or more, a light emitting device having a light emission wavelength of 440 nm or more can be formed.

12 Claims, 13 Drawing Sheets

U.S. PATENT DOCUMENTS

| | | | |
|---|---|---|---|
| 6,998,284 B2 * | 2/2006 | Kyono et al. | 438/46 |
| 2007/0026551 A1 | 2/2007 | Sato et al. | |
| 2007/0080369 A1 | 4/2007 | Sakai | |

FOREIGN PATENT DOCUMENTS

| | | |
|---|---|---|
| JP | 2007-036113 | 2/2007 |
| JP | 2007-103774 | 4/2007 |
| WO | WO 2007/063920 A1 | 6/2007 |

OTHER PUBLICATIONS

Haskell et al., "Defect reduction in (1120) a—plane gallium nitride via lateral epitaxial overgrowth by hydride vapor-phase epitaxy", 2001, Appl. Phys. Lett., vol. 83, No. 4, pp. 644-646.*

Chakraborty et al., "Structural and Electroluminescence Characteristics of Nonpolar Light-Emitting Diodes Fabricated on Lateral Epitaxially Overgrown a-Plane GaN", Japanese Journal of Applied Physics, vol. 45, No. 11, pp. 8659-8661 (2006).

Ko et al., "Optical Characteristics of a-Plane InGaN/GaN Multiple Quantum Wells With Difference Well Widths", Applied Physics Letters, vol. 90, No. 18, pp. 181122-1-181122-3 (2007).

Chakraborty et al., "Nonpolar InGaN/GaN Emitters on Reduced-Defect Lateral Epitaxially Overgrown a-Plane GaN With Drive-Current-Independent Electroluminescence Emission Peak", Applied Physics Letters, vol. 85, No. 22, pp. 5143-5145 (2004).

* cited by examiner

NITRIDE SEMICONDUCTOR LIGHT EMITTING DEVICE AND METHOD FOR FORMING THE SAME

TECHNICAL FIELD

The present invention relates to a nitride semiconductor light emitting device and a method for forming the same.

BACKGROUND ART

In Non-Patent Document 1, an InGaN-based light emitting diode has been disclosed. This light emitting diode is formed on an a-plane GaN template formed by lateral overgrowth. An active layer of the light emitting diode has a 5-period multi-quantum well structure including $In_{0.17}Ga_{0.83}N$ well layers (4 nm)/Si doped GaN barrier layers (16 nm). According to the measurement of properties in a wafer state at a current of 250 mA, the light emitting diode has a light emission wavelength of 413.5 nm, a light output of 1.5 mW, and an external quantum efficiency of 0.2%.

In Patent Document 1, a laser diode having an $In_{0.1}Ga_{0.9}N$ active layer provided on a GaN (1-100) substrate has been disclosed. In addition, a vertical cavity surface-emitting laser having $In_{0.15}Ga_{0..85}N$ well layers and $In_{0.05}Ga_{0.95}N$ barrier layers provided on a high resistivity SiC (11-20) substrate has also been disclosed. Furthermore, a vertical cavity surface-emitting laser having $In_{0.2}Ga_{0.8}N$ well layers of a thickness of 4 nm and $In_{0.05}Ga_{0.95}N$ barrier layers of a thickness of 4 nm provided on the (1-100) or (11-20) plane of a high resistivity SiC substrate has also been disclosed.

[Non-Patent Document 1] Applied Physics Letter Vol. 85, No. 22 (2004), p. 5143
[Patent Document 1] Japanese Unexamined Patent Application Publication No. 10-135576

DISCLOSURE OF INVENTION

Problems to be Solved by the Invention

In a semiconductor light emitting device having an active layer composed of a gallium nitride-based semiconductor, since a so-called c-plane GaN substrate is used, influences caused by a piezoelectric effect also appear on the active layer. On the other hand, even in GaN, the a-plane thereof exhibits non-polar properties, and hence it is expected that the active layer is not influenced by a piezoelectric effect. In the Non-Patent Document 1, a light emitting diode having an InGaN-based quantum well structure formed on the a-plane GaN template has been disclosed. In the Patent Document 1, although InGaN active layers and InGaN well layers having several indium compositions have been disclosed, particular description relating to the light emission wavelength and light emission intensity has been hardly disclosed.

A light emitting diode having a light emission wavelength longer than the peak wavelength of the light emitting diode disclosed in the Non-Patent Document 1 has been desired. However, according to an experiment carried out by the inventor of the present invention, when a quantum well structure is formed on a-plane GaN under growth conditions used for forming a quantum well structure on c-plane GaN, a desired photoluminescence wavelength cannot be obtained. In addition, according to various experimental results, in terms of light emission intensity as well as the photoluminescence wavelength, a light emitting device having an InGaN-based active layer formed on a-plane GaN shows a different tendency from that of a light emitting device having an InGaN-based active layer formed on c-plane GaN.

The present invention has been conceived in consideration of the situation described above, and an object of the present invention is to provide a nitride semiconductor light emitting device having the structure which uses a non-polar gallium nitride-based semiconductor relating to the a-plane and which can provide superior light emission intensity and is also to provide a method for forming the nitride semiconductor light emitting device.

Means for Solving the Problems

According to one aspect of the present invention, there is provided a nitride semiconductor light emitting device which comprises: (a) a first conduction type gallium nitride-based semiconductor region; (b) a second conduction type gallium nitride-based semiconductor region; and (c) an active layer which is provided between the first conduction type gallium nitride-based semiconductor region and the second conduction type gallium nitride-based semiconductor region so as to emit light having a wavelength in the range of 440 to 550 nm. In the above nitride semiconductor light emitting device, the active layer includes a well layer composed of hexagonal $In_XGa_{1-X}N$ ($0.16 \leq X \leq 0.35$, the indium composition X: strained composition), a thickness D of the well layer is more than 2.5 nm, the thickness D of the well layer is 10 nm or less, the indium composition X and the thickness D satisfy $X \geq -0.1 \times D + 0.6$, the first conduction type gallium nitride-based semiconductor region, the active layer, and the second conduction type gallium nitride-based semiconductor region are disposed in a predetermined axis direction, and the a-plane of the hexagonal $In_XGa_{1-X}N$ is aligned in the predetermined axis direction.

According to this nitride semiconductor light emitting device, since the a-plane of the hexagonal $In_XGa_{1-X}N$ of the well layer is aligned in the predetermined axis direction, the active layer substantially exhibits non-polar properties. In addition, the well layer is composed of hexagonal $In_XGa_{1-X}N$ ($0.16 \leq X \leq 0.35$, X: strained composition). The indium composition of a non-polar InGaN well layer relating to the a-plane is higher than that of a non-polar InGaN of a nitride semiconductor light emitting device formed under c-plane growth conditions. Hence, compared to the nitride semiconductor light emitting device formed under the c-plane growth conditions, the nitride semiconductor light emitting device according to the present invention has superior light emission intensity. Furthermore, since the well layer is composed of hexagonal $In_XGa_{1-X}N$ ($0.16 \leq X \leq 0.35$, X: strained composition) and also has a thickness in the range of more than 2.5 nm to 10 nm, a quantum well structure which emits light having a wavelength of 440 to 550 nm is provided.

In the nitride semiconductor light emitting device according to the present invention, the active layer may include a barrier layer composed of hexagonal $In_YGa_{1-Y}N$ ($0 \leq Y \leq 0.05$, Y: strained composition).

According to this nitride semiconductor light emitting device, the active layer may have a quantum well structure, and the hexagonal $In_YGa_{1-Y}N$ ($0 \leq Y \leq 0.05$, Y: strained composition) has a preferable indium composition for a non-polar InGaN barrier layer.

The nitride semiconductor light emitting device according to the present invention may further comprise a substrate composed of a hexagonal $Al_ZGa_{1-Z}N$ semiconductor ($0 \leq Z \leq 1$). The first conduction type gallium nitride-based semiconductor region, the active layer, and the second conduction type gallium nitride-based semiconductor region are mounted on a primary surface of the substrate.

According to this nitride semiconductor light emitting device, since the first conduction type gallium nitride-based semiconductor region, the active layer, and the second conduction type gallium nitride-based semiconductor region are formed on the hexagonal $Al_ZGa_{1-Z}N$ semiconductor, the crystallinities thereof are superior.

In the nitride semiconductor light emitting device according to the present invention, the primary surface of the substrate may be off-oriented from the a-plane by an off angle) ($-2° \leqq \theta \leqq +2°$). According to this nitride semiconductor light emitting device, a semiconductor crystal having superior quality can be obtained without substantially receiving any influences of polar properties.

In the nitride semiconductor light emitting device according to the present invention, threading dislocations of the substrate extend in the c-axis direction. According to this nitride semiconductor light emitting device, since extending in the c-axis direction, these threading dislocations extend substantially in parallel to the primary surface of the substrate. In addition, in the nitride semiconductor light emitting device according to the present invention, the average density of threading dislocations intersecting the c-plane of the substrate is preferably $1 \times 10^7$ cm$^{-2}$ or less. According to this nitride semiconductor light emitting device, since the density of the threading dislocations intersecting the c-plane is low, the density of threading dislocations which successively extend therefrom when the growth is performed on the a-plane primary surface is also made low.

In the nitride semiconductor light emitting device according to the present invention, the substrate includes a first region having a density of threading dislocations extending in the c-axis direction higher than a first threading dislocation density and a second region having a density of threading dislocations extending in the c-axis direction lower than the first threading dislocation density, and the second region appears on the primary surface of the substrate. According to this nitride semiconductor light emitting device, a semiconductor grown on the second region which appears on the a-plane primary surface has a low threading dislocation density.

In the nitride semiconductor light emitting device according to the present invention, the density of threading dislocations in the second region is preferably less than $1 \times 10^7$ cm$^{-2}$. According to this nitride semiconductor light emitting device, since the second region having a threading dislocation density of less than $1 \times 10^7$ cm$^{-2}$ appears on the a-plane primary surface, a semiconductor grown thereon has a very low threading dislocation density.

In accordance with another aspect of the present invention, there is provided a method for forming a nitride semiconductor light emitting device. The method described above comprises: (a) a step of preparing a substrate composed of a hexagonal $Al_ZGa_{1-Z}N$ semiconductor ($0 \leqq Z \leqq 1$); (b) a step of forming a first conduction type gallium nitride-based semiconductor film on a primary surface of the substrate; (c) a step of forming an active layer which emits light having a wavelength in the range of 440 to 550 nm on the first conduction type gallium nitride-based semiconductor film; and (d) a step of forming a second conduction type gallium nitride-based semiconductor film on the active layer. In the method described above, the first conduction type gallium nitride-based semiconductor film, the active layer, and the second conduction type gallium nitride-based semiconductor film are disposed on the primary surface of the substrate in a predetermined axis direction, a first semiconductor layer composed of hexagonal $In_XGa_{1-X}N$ ($0.16 \leqq X \leqq 0.35$, X: strained composition) and having a first gallium composition is grown at a first temperature in the step of forming the active layer, a second semiconductor layer composed of hexagonal $In_YGa_{1-Y}N$ ($0 \leqq Y \leqq 0.05$, Y<X, Y: strained composition) and having a second gallium composition is grown at a second temperature in the step of forming the active layer, the first gallium composition is lower than the second gallium composition, the first temperature is lower than the second temperature, the difference between the first temperature and the second temperature is 105° C. or more, and the a-plane of the hexagonal $In_XGa_{1-X}N$ is aligned in the predetermined axis direction.

According to this method, in the formation of the active layer in which the a-plane of the hexagonal $In_XGa_{1-X}N$ is aligned in the predetermined axis direction, since the difference in growth temperature between the two types of gallium nitride semiconductors in which the first gallium composition is lower than the second gallium composition is 105° C. or more, the first semiconductor layer may be used as a well layer by increasing the indium composition thereof.

According to the method of the present invention, the substrate is obtained by cutting a hexagonal $Al_ZGa_{1-Z}N$ ($0 \leqq Z \leqq 1$) crystal grown in the c-axis direction so as to intersect the a-axis (axis perpendicular to the a-plane) thereof, and the primary surface of the substrate is processed by a polishing treatment and extends along a plane intersecting the a-axis.

By this method, since the crystal growth extends in the c-axis direction, the threading dislocations also extend in the c-axis direction. When a semiconductor plate is cut off from the hexagonal $Al_ZGa_{1-Z}N$ semiconductor so as to intersect the a-axis thereof, a substrate can be provided which is suitable to form an active layer in which the a-plane of the hexagonal $In_XGa_{1-X}N$ is aligned in a predetermined axis direction.

According to the method of the present invention, the substrate includes a plurality of first regions in each of which the density of threading dislocations extending in the c-axis direction is higher than a first threading dislocation density and a plurality of second regions in each of which the density of threading dislocations extending in the c-axis direction is lower than the first threading dislocation density, the first regions and the second regions are alternately disposed, and one of the second regions appears on the primary surface of the substrate.

According to this method, a semiconductor grown on the second region which appears on the a-plane primary surface has a low threading dislocation density.

According to the method of the present invention, the density of threading dislocations of each of the second regions is preferably less than $1 \times 10^7$ cm$^{-2}$. By this method, a semiconductor crystal having superior quality can be obtained without receiving any influences of dislocations.

According to the method of the present invention, the primary surface of the substrate may be off-oriented from the a-plane by an off-angle)($-2° \leqq \theta \leqq +2°$). By this method, a semiconductor crystal having superior quality can be obtained without substantially receiving any influences of polar properties.

According to the method of the present invention, before the first conduction type gallium nitride-based semiconductor film is formed, while gas containing ammonia and hydrogen is supplied, a step of performing a heat treatment of the substrate may be further provided.

By this method, since the substrate is heat-treated in gas containing ammonia and hydrogen before the gallium nitride-based semiconductor is grown, a flat substrate surface is easily obtained, and hence a semiconductor light emitting device having more superior light emission properties can be obtained.

The above objects, other objects, features, and advantages of the present invention will be more easily understood from the following detailed description of preferred embodiments of the present invention with reference to accompanying drawings.

Advantages

As has thus been described, according to the present invention, there is provided a nitride semiconductor light emitting device having the structure which uses a non-polar gallium nitride-based semiconductor relating to the a-plane and which can provide superior light emission intensity. In addition, according to the present invention, a method for forming a nitride semiconductor light emitting device is provided, and by this method, a non-polar gallium nitride-based semiconductor is used, and in addition, superior light emission intensity is provided.

REFERENCE NUMERALS

Figure 1:
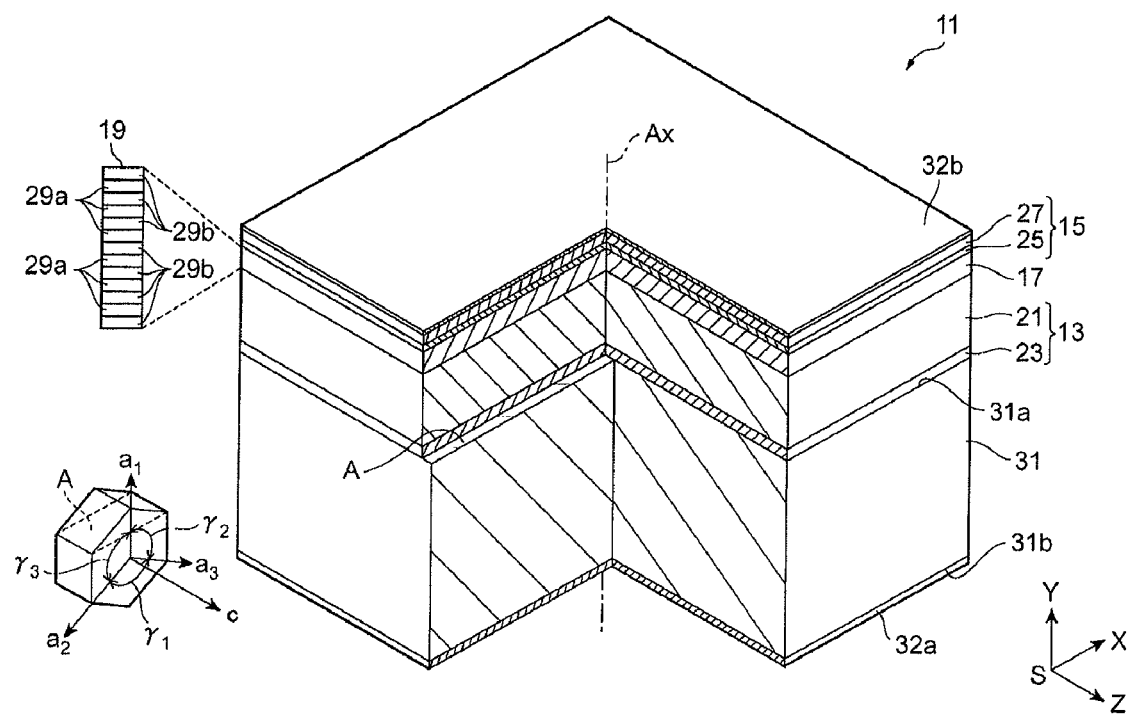
FIG. 1 is a view schematically showing a nitride semiconductor light emitting device according to this embodiment.

Ax predetermined axis
11 nitride semiconductor light emitting device
13 first conduction type gallium nitride-based semiconductor region
15 second conduction type gallium nitride-based semiconductor region
17 active layer
19 quantum well structure
21 cladding layer
23 semiconductor layer
25 electron blocking layer
27 contact layer
29a well layer
29b barrier layer
31 substrate
32a, 32b electrode
33, 35 substrate
33c, 35c first region (high dislocation region)
33d, 35d second region (low dislocation region)

BEST MODES FOR CARRYING OUT THE INVENTION

The findings of the present invention will be easily understood in consideration of the following detailed description with reference to the accompanying drawings shown by way of example. Continuously, with reference to the accompanying drawings, embodiments of a nitride semiconductor light emitting device and a method for manufacturing a nitride semiconductor light emitting device according to the present invention will be described. When it is possible, identical elements are designated by identical reference marks.

FIG. 1 is a view schematically showing a nitride semiconductor light emitting device according to this embodiment. As the nitride semiconductor light emitting device, for example, a light emitting diode or a laser diode may be mentioned. A nitride semiconductor light emitting device 11 has a first conduction type gallium nitride-based semiconductor region 13, a second conduction type gallium nitride-based semiconductor region 15, and an active layer 17. The active layer 17 is provided between the first conduction type gallium nitride-based semiconductor region 13 and the second conduction type gallium nitride-based semiconductor region 15. The active layer 17 may be formed from a single InGaN semiconductor well layer or may have a quantum well structure 19. The active layer 17 is provided so as to emit light having a wavelength of 440 nm or more. In addition, the active layer 17 is provided so as to emit light having a wavelength of 550 nm or less. The first conduction type gallium nitride-based semiconductor region 13, the active layer 17, and the second conduction type gallium nitride-based semiconductor region 15 are disposed in a predetermined axis Ax direction. The active layer 17 includes a well layer composed of hexagonal $In_XGa_{1-X}N$, and the indium composition X is represented by a strained composition. The a-plane of the hexagonal $In_XGa_{1-X}N$ is aligned in the predetermined axis Ax direction. In the well layer of the active layer 17, carriers are confined which are supplied from the first conduction type gallium nitride-based semiconductor region 13 and the second conduction type gallium nitride-based semiconductor region 15. Compared to the band gap of this well layer, the band gaps of the first conduction type gallium nitride-based semiconductor region 13 and the second conduction type gallium nitride-based semiconductor region 15 are large.

When the well layer is formed to have a thickness of 2.5 nm or more, a light emitting device having a light emission wavelength of 440 nm or more can be formed. When the thickness of the well layer is more than 10 nm, the crystal quality thereof is degraded, and the light emission properties are degraded.

As can be understood from a coordinate system shown in FIG. 1, the hexagonal $In_XGa_{1-X}N$ is represented by using the c axis and three axes a1, a2, and a3 perpendicularly intersecting this c axis. The three axes a1, a2, and a3 form an angle of 120° therebetween (γ1, γ2, γ3). The c axis of the hexagonal system is aligned in a Z axis of an orthogonal coordinate system S, and the axis a1 is aligned in a Y axis direction of the orthogonal coordinate system S. In FIG. 1, a typical a-plane is shown.

In the nitride semiconductor light emitting device 11 in which the a-plane of this hexagonal $In_XGa_{1-X}N$ is aligned in the predetermined axis Ax direction, when the indium composition X is 0.16 or more, this hexagonal InGaN is preferably used for an active layer of a light emitting device having a light emission of 440 nm or more. In addition, when the indium composition is more than 0.35, the crystal quality of InGaN is degraded, and the light emission properties are degraded.

The reason for this is described below. Even when the indium composition of an InGaN-based light emitting device formed on a-plane GaN is equal to the indium composition of an InGaN-based light emitting device formed on c-plane GaN, a photoluminescence wavelength of the InGaN-based light emitting device formed on the a-plane GaN is shorter than that of the InGaN-based light emitting device formed on the c-plane GaN. Hence, in the InGaN-based light emitting device formed on the a-plane GaN, in order to obtain a desired photoluminescence wavelength, InGaN having a higher indium composition must be grown. In addition, in order to obtain a wavelength longer than the light emission wavelength of the light emitting diode disclosed in the Non-Patent Document 1, the indium composition must be further increased.

As described above, according to the nitride semiconductor light emitting device 11, since the a-plane of the hexagonal $In_XG_{1-X}N$ of the well layer is aligned in the predetermined axis direction, the active layer 17 exhibits non-polar properties. In addition, the well layer of the active layer 17 is composed of hexagonal $In_XG_{1-X}N$ ($0.16 \leq X \leq 0.35$, X: strained composition). The indium composition of this non-polar InGaN well layer is set to a large value as compared to that of a non-polar InGaN well layer of a nitride semiconductor light emitting device formed under c-plane growth conditions, the light emission intensity of the nitride semiconductor light emitting device of this embodiment is superior to that of the nitride semiconductor light emitting device formed under the c-plane growth conditions. Furthermore, since the well layer of the active layer 17 is composed of hexagonal $In_XG_{1-X}N$ ($0.16 \leq X \leq 0.35$, X: strained composition), and in addition, the thickness of the well layer is in the range of more than 2.5 nm to 10 nm, the active layer 17 is provides so as to emit light having a light emission wavelength in the range of 440 to 550 nm. In a light emitting device emitting light having a light emission wavelength of 440 to 550 nm, shortening of light emission wavelength (blue shift) apparently occurs as a current density is increased; however, since the blue shift can be suppressed by using a non-polar surface, an effect of using an a-plane GaN substrate is particularly significant.

The first conduction type gallium nitride-based semiconductor region 13 may, for example, include a cladding layer 21 composed of a gallium nitride-based semiconductor having a larger band gap than that of the active layer, and the gallium nitride-based semiconductor may be, for example, n-type GaN, or n-type AlGaN. Whenever necessary, the first conduction type gallium nitride-based semiconductor region 13 may include a semiconductor layer 23 composed of an n-type AlGaN gallium nitride semiconductor.

The second conduction type gallium nitride-based semiconductor region 15 may, for example, include an electron blocking layer 25 composed of a gallium nitride-based semiconductor having a larger band gap than that of the active layer, and this gallium nitride-based semiconductor may be, for example, p-type GaN. The second conduction type gallium nitride-based semiconductor region 15 may, for example, include a contact layer 27 composed of a p-type gallium nitride-based semiconductor, and this gallium nitride-based semiconductor may be, for example, p-type GaN.

In the nitride semiconductor light emitting device 11 according to one example, the active layer 17 includes the quantum well structure 19. The quantum well structure 19 may include well layers 29a and barrier layers 29b. The well layers 29a and the barrier layers 29b are alternately disposed to each other. In the nitride semiconductor light emitting device 11, the well layer 29a may be composed of hexagonal $In_XG_{1-X}N$ ($0.16 \leq X \leq 0.35$, X: strained composition). In addition, the barrier layer 29b of the active layer 17 may be composed of hexagonal $In_YGa_{1-Y}N$ ($0 \leq Y \leq 0.05$, Y: strained composition). The hexagonal $In_YGa_{1-Y}N$ has a preferable indium composition for a non-polar InGaN barrier layer. The indium composition of the hexagonal $In_YGa_{1-Y}N$ may be 0 or more (when the indium composition is 0, the barrier layer is composed of GaN). In addition, since a sufficient energy barrier is obtained between the well layer and the barrier layer, the indium composition of the hexagonal $In_YGa_{1-Y}N$ may be 0.05 or less. This indium composition is represented by a strained composition. The thickness of the barrier layer 29b may be set to 5 nm or more. The reason for this is that carriers can be sufficiently confined in the well layer. In addition, the thickness of the barrier layer 29b may be set to 20 nm or less. The reason for this is that a sufficiently low element resistance can be obtained. The barrier layer 29b is composed, for example, of GaN or InGaN.

The nitride semiconductor light emitting device 11 may further include a substrate 31 composed of a hexagonal $Al_ZGa_{1-Z}N$ semiconductor ($0 \leq Z \leq 1$). The substrate 31 preferably exhibits electrical conductivity. The first conduction type gallium nitride-based semiconductor region 13, the active layer 17, and the second conduction type gallium nitride-based semiconductor region 15 are mounted on a primary surface 31a of the substrate 31. Since the first conduction type gallium nitride-based semiconductor region 13, the active layer 17, and the second conduction type gallium nitride-based semiconductor region 15 can be formed on the hexagonal $Al_ZGa_{1-Z}N$ semiconductor, the crystallinities thereof are superior. As a material of the substrate 31, for example, GaN, AlGaN, or AlN may be used. The material for the substrate 31 is preferably n-type GaN. An electrode 32a (such as a cathode) is provided on a back surface 31b of the substrate 31, and another electrode 32b (such as an anode) is provided on the contact layer 27.

Although the primary surface 31a of the substrate 31 may be set parallel to the a-plane, it may be off-oriented from the a-plane by a certain off angle. The off angle, hereinafter referred to as "Angle Off", is defined by an angle formed between the normal of the primary surface 31a of the substrate 31 and the normal of the a-plane. The Angle Off may be set, for example, such that $-2° \leq \theta \leq +2°$ is satisfied in the c-axis direction and may be set such that $-2° \leq \theta \leq +2°$ is satisfied in the m-axis direction. According to this substrate 31, a semiconductor crystal having superior quality can be obtained without receiving any influences of polar properties.

In the nitride semiconductor light emitting device 11, threading dislocations of the substrate 31 extend in the c-axis direction. Since extending in the c-axis direction, the threading dislocations extend substantially parallel to the primary surface 31a of the substrate 31. In addition, the average density of threading dislocations intersecting the c-plane of the substrate 31 is preferably $1 \times 10^7$ cm$^{-2}$ or less (such as the density of threading dislocations which are randomly distributed). According to this substrate 31, since the density of threading dislocations intersecting the c-plane is low, the density of threading dislocations which successively extend therefrom when the growth is performed on the a-plane primary surface is also made low. The substrate 31 as described above is obtained by cutting from a crystal of hexagonal Al$_Z$Ga$_{1-Z}$N ($0 \leq Z \leq 1$) grown in the c-axis direction so as to intersect the a-axis, and the primary surface 31a is processed by a polishing treatment and also extends along a plane intersecting the a axis. Since the growth of the semiconductor crystal for the substrate 31 extends in the c-axis direction, the threading dislocations also extend in the c-axis direction. When a semiconductor plate is cut off from a hexagonal Al$_Z$Ga$_{1-Z}$N semiconductor crystal so as to intersect the a-axis, this substrate 31 is preferable for forming an active layer in which the a-plane of the hexagonal In$_X$G$_{1-X}$N is aligned in the predetermined axis Ax direction.

Figure 2:
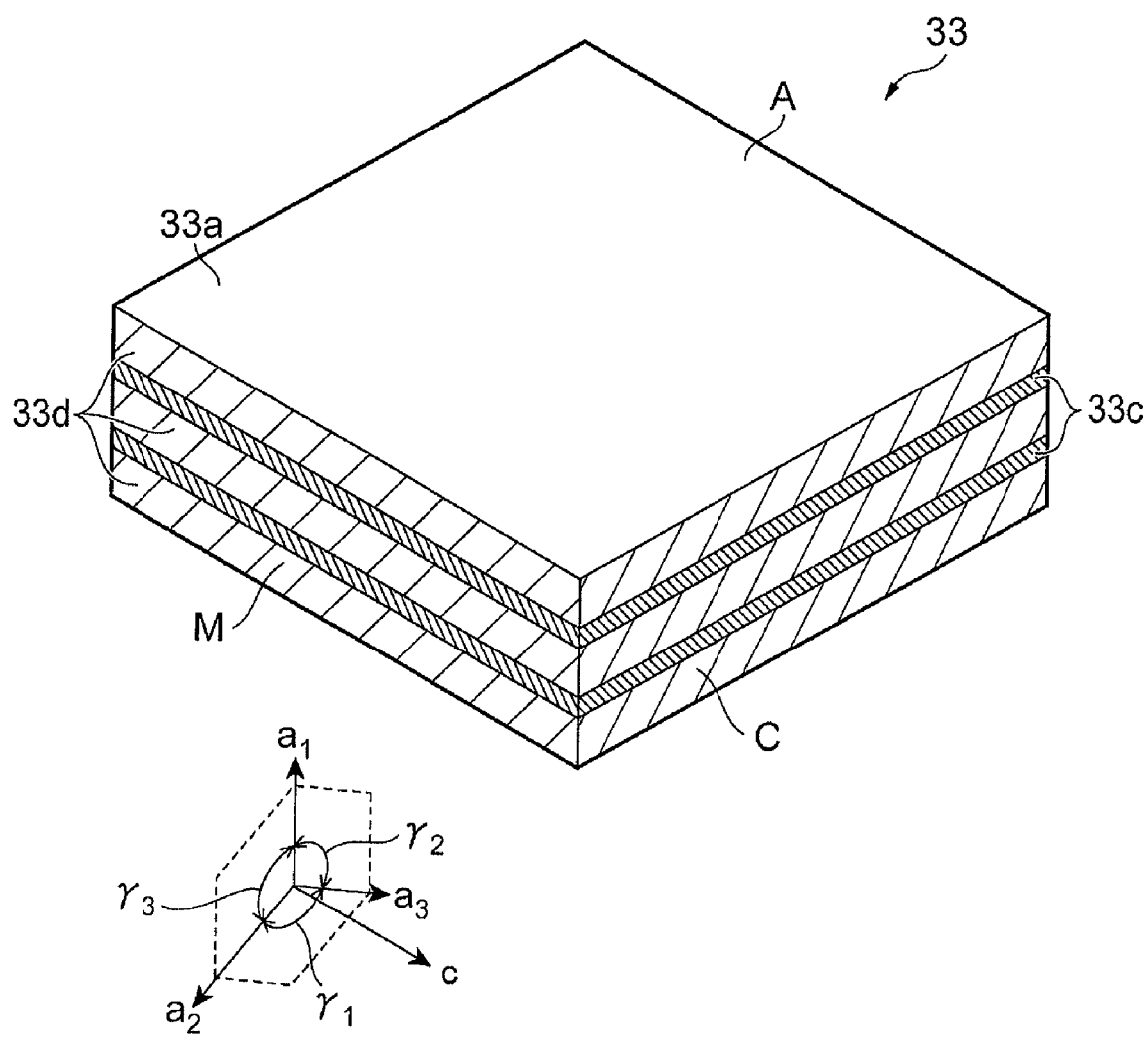
FIG. 2 is a view showing one example of a gallium nitride substrate for the nitride semiconductor light emitting device.

FIG. 2 is a view showing one example of a gallium nitride substrate for the nitride semiconductor light emitting device 11. Also in FIG. 2, a coordinate system for the hexagonal system is shown as in FIG. 1. In FIG. 2, the c-plane is represented by reference mark "C", and reference marks "A" and "M" represent the a-plane and the m-plane, respectively. A first region (high dislocation region) 33c having a relatively high threading dislocation density does not appear on a first surface 33a of a gallium nitride substrate 33 according to one example, and the first surface 33a is formed of an area on which a second region (low dislocation region) 33d having a relatively low threading dislocation density appears. The first regions 33c and the second regions 33d are alternately disposed, and at the c-plane and the m-plane, first areas form a stripe shape. The first surface 33a extend along a plane intersecting the a-axis. Most of the threading dislocations extend in the c-axis direction. A semiconductor grown on the second region 33d which appears on the a-plane primary surface has a low threading dislocation density. In addition, as described above, the first surface 33a of the gallium nitride substrate 33 may be inclined by a certain angle with respect to the a-plane.

The threading dislocation density in the second region 33d at the c-plane is preferably, for example, $1 \times 10^7$ cm$^{-2}$ or less. Since the second region 33d having a threading dislocation density of $1 \times 10^7$ cm$^{-2}$ or less appears on the a-plane primary surface, a semiconductor formed on the second region 33d has a very low threading dislocation density.

Figure 3:
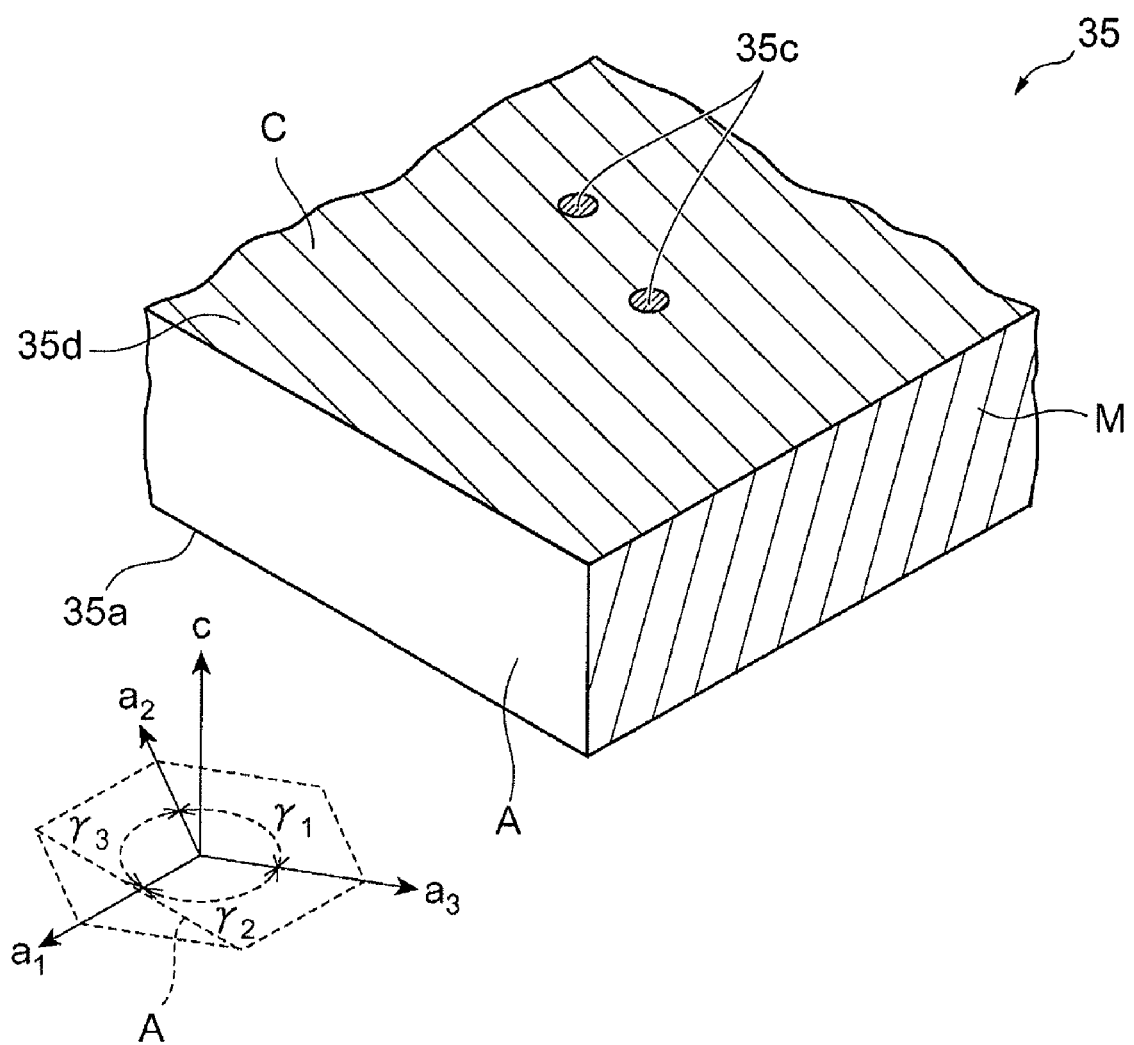
FIG. 3 is a view showing another example of the gallium nitride substrate for the nitride semiconductor light emitting device.

FIG. 3 is a view showing another example of the gallium nitride substrate for the nitride semiconductor light emitting device 11. Also in FIG. 3, a coordinate system for the hexagonal system is shown as in FIG. 1. In FIG. 3, the c-plane is represented by reference mark "C", and reference marks "A" and "M" represent the a-plane and the m-plane, respectively. A first surface 35a of a gallium nitride substrate 35 according to the example is formed of an area on which no first regions (high dislocation regions) 35c each having a relatively high threading dislocation density appear, and on which a second region (low dislocation region) 35d having a relatively low threading dislocation density appears. The first regions 35c are disposed in the second region 35d. Hence, first areas are disposed in a second area to form a dotted pattern at the c-plane. Most of the threading dislocations extend in the c-axis direction. A semiconductor grown on the second region 35d which appears on the a-plane primary surface has a low threading dislocation density. In addition, as described above, the first surface 35a of the gallium nitride substrate 35 may be inclined by a certain angle with respect to the a-plane. The threading dislocation density of the second region 35d is preferably, for example, $1 \times 10^7$ cm$^{-2}$ or less at the c-plane. When cutting is performed along the a-plane so that the first regions (high dislocation region) 35c do not appear on the first surfaced 35a, a substrate in which only the second region (low dislocation region) 35d appears on the first surface 35a can be formed. Since the second region 35d having a treading dislocation density of $1 \times 10^7$ cm$^{-2}$ or less appears on the a-plane primary surface, a semiconductor grown on the second region 35d has a very low threading dislocation density.

Figure 4:
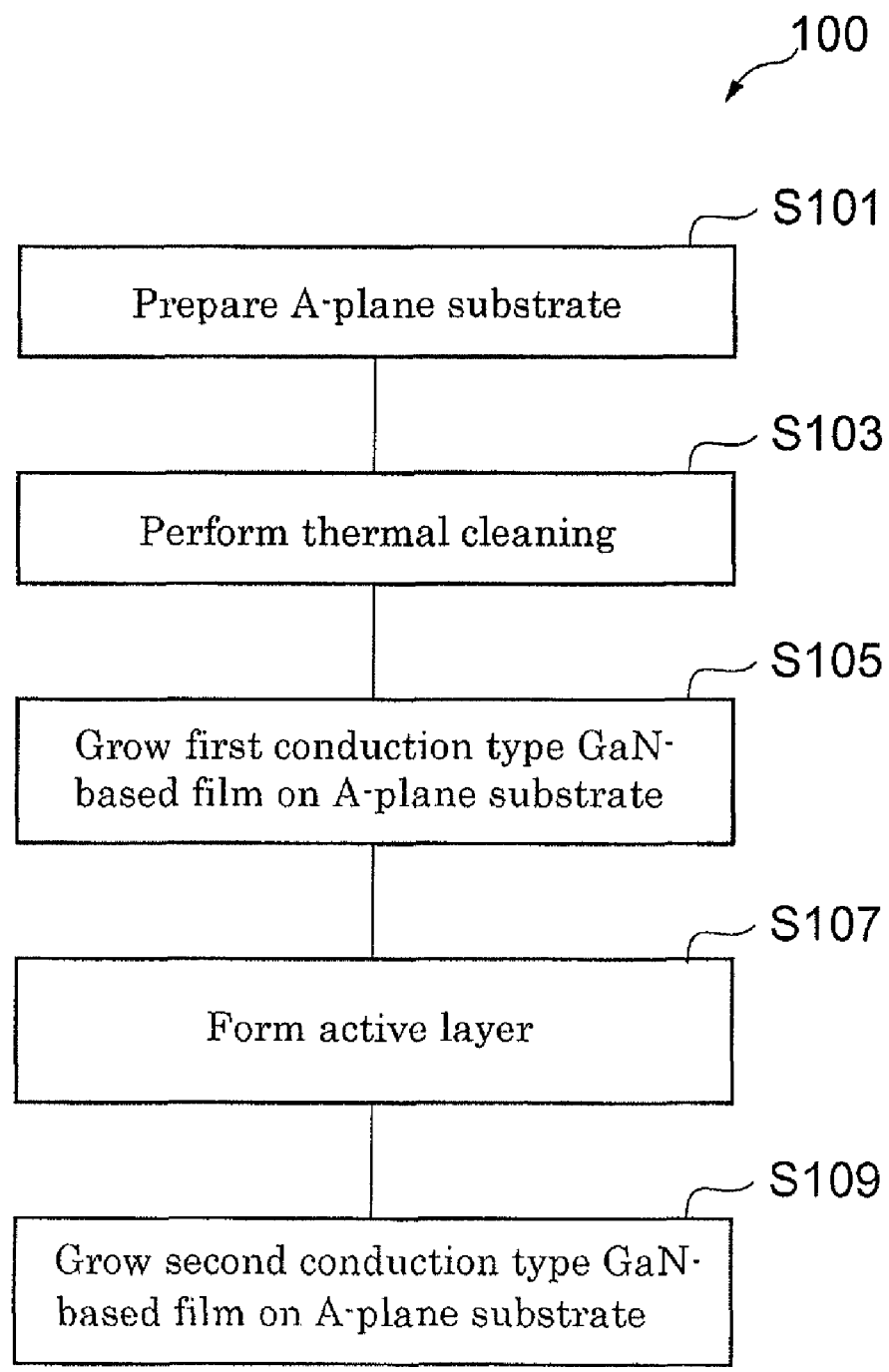
FIG. 4 is a view showing primary steps of forming a light emitting device.

Continuously, an example will be described. As described below, a light emitting device including an active layer provided so as to emit light having a wavelength in the range of 440 to 550 nm can be formed. In this example, a blue light emitting device is formed by a metal organic chemical vapor deposition method. As source materials for a metal organic chemical vapor deposition method, trimethylgallium, trimethylaluminum, trimethylindium, ammonia, monosilane, and cyclopentadienyl magnesium were used. FIG. 4 is a flow 100 of primary steps of forming a light emitting device such as a light emitting diode or a laser diode.

As shown in FIG. 4, in Step S101, a substrate composed of hexagonal Al$_Z$Ga$_{1-Z}$N ($0 \leq Z \leq 1$) is prepared. In this example, after a freestanding GaN body was formed by slicing an n-type GaN crystal which had at the c-plane, low defect regions each having a threading dislocation density of less than $1 \times 10^6$ cm$^{-2}$ and defect concentrated regions distributed in a stripe pattern and which was grown in the (0001) direction, this freestanding GaN body was polished, so that an a-plane GaN (11-20) substrate was formed.

In Step S103, prior to the formation of a first conduction type gallium nitride-based semiconductor film, the a-plane GaN substrate is processed by a heat treatment while gas containing ammonia and hydrogen is being supplied. For this treatment, the n-type a-plane GaN substrate was placed on a susceptor, the pressure inside a reactor was set to 30 KPa, and ammonia and hydrogen were supplied in the reactor, so that cleaning was performed for 10 minutes at a substrate temperature of 1,050° C. By this heat treatment, a flat substrate surface can be easily obtained, and in addition, a semiconductor light emitting device having more superior light emission properties can be obtained.

In Step S105, the first conduction type gallium nitride-based semiconductor film is then formed on a primary surface of the substrate. In this example, after the substrate temperature was increased to 1,100° C., an n-type Al$_{0.12}$Ga$_{0.88}$N layer was grown. For this growth, hydrogen was primarily used as a carrier gas, and trimethylgallium (24 μmol/minute), trimethylaluminum (4.3 μmol/minute), ammonia (0.22 mol/minute), and monosilane were supplied. The thickness of the AlGaN film is, for example, 50 nm.

Next, after the growth was once stopped, and the substrate temperature was increased to 1,150° C., an n-type GaN layer was grown. For this growth, hydrogen was primarily used as a carrier gas, and trimethylgallium (244 μmol/minute), ammonia (0.33 mol/minute), and monosilane were supplied. The thickness of the GaN film is, for example, 2 μm.

Next, in Step S107, an active layer is formed on the first conduction type gallium nitride-based semiconductor film so as to emit light having a wavelength in the range of 440 to 550 nm. For this formation, after the growth was once stopped, and the substrate temperature was decreased to 880° C., an In$_{0.01}$Ga$_{0.99}$N barrier layer was grown. The thickness of this barrier layer is, for example, 15 nm. For this growth, nitrogen was primarily used as a carrier gas, and trimethylgallium (24 μmol/minute), trimethylindium (1.6 μmol/minute), and ammonia (0.27 mol/minute) were supplied. After the InGaN barrier layer was grown, and the substrate temperature was then decreased to 750° C., an $In_{0.27}Ga_{0.73}N$ well layer was grown. The thickness of this well layer is, for example, 5 nm. For this growth, nitrogen was primarily used as a carrier gas, and trimethylgallium (24 μmol/minute), trimethylindium (24 μmol/minute), and ammonia (0.36 mol/minute) were supplied. The growth of the undoped barrier layer and that of the undoped well layer were repeatedly performed, so that, for example, a 6-period quantum well layer was formed.

Next, in Step S109, a second conduction type gallium nitride-based semiconductor film is formed on the active layer. For this formation, after the growth was again once stopped, and the substrate temperature was increased to 1,050° C., a p-type $Al_{0.15}Ga_{0.85}N$ electron blocking layer was grown. For this growth, hydrogen was primarily used as a carrier gas, and trimethylgallium (24 μmol/minute), trimethylaluminum (2.3 μmol/minute), ammonia (0.22 mol/minute), and cyclopentadienyl magnesium were supplied. The thickness of the electron blocking layer is, for example, 20 nm.

After the p-type AlGaN electron blocking layer was grown, a p-type GaN layer was grown. For this growth, hydrogen was primarily used as a carrier gas, and trimethylgallium (99 μmol/minute), ammonia (0.22 mol/minute), and cyclopentadienyl magnesium were supplied. The thickness of this GaN layer is, for example, 25 nm.

After the p-type GaN layer was grown, a p-type GaN contact layer was grown. The thickness of this GaN contact layer is, for example, 25 nm. For this growth, hydrogen was primarily used as a carrier gas, and trimethylgallium (67 μmol/minute), ammonia (0.22 mol/minute), and cyclopentadienyl magnesium were supplied.

By the steps described above, an epitaxial wafer for this light emitting diode (LED) was formed. The a-plane of each gallium nitride-based semiconductor film of the epitaxial wafer is substantially parallel to a plane surface extending along the primary surface of the GaN substrate.

Figure 5A:
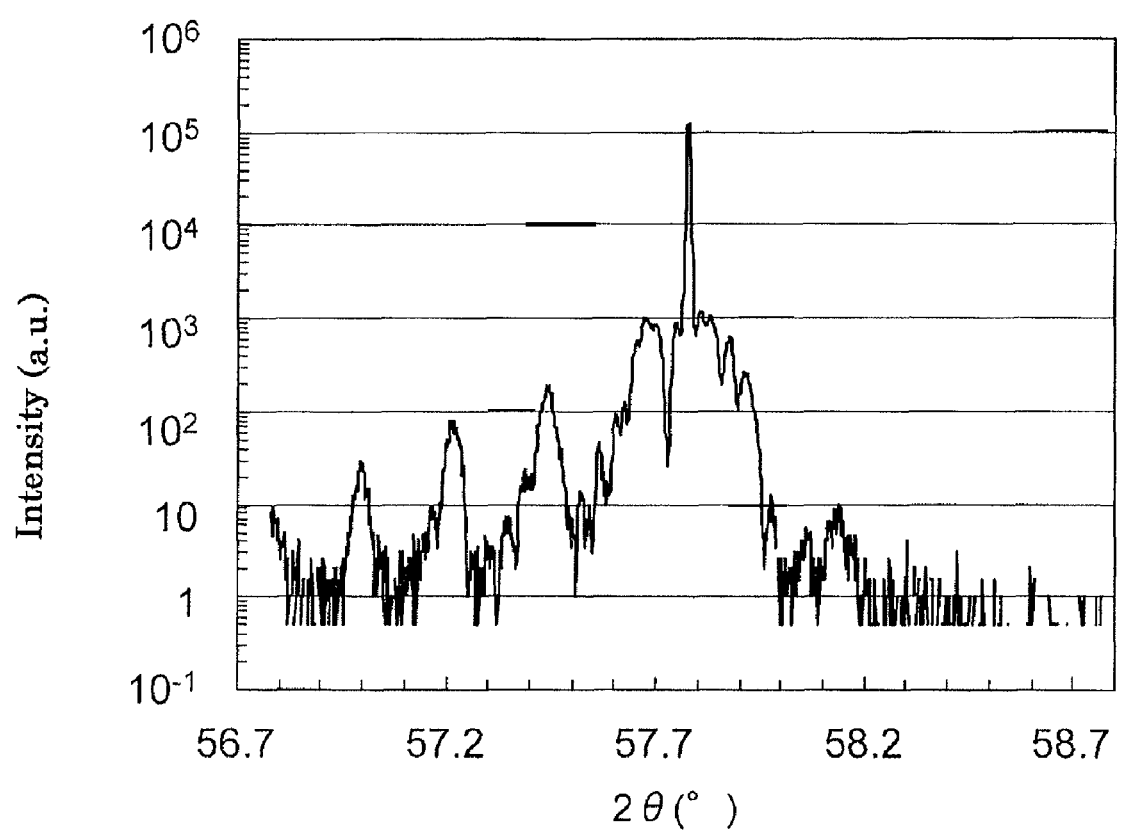
FIG. 5A is a view showing an x-ray diffraction measurement ($\overline{\omega}$–2θ measurement) result of the (11-20) plane in which satellite peaks are shown.

Subsequently, the GaN substrate was taken out from a reactor, x-ray diffraction measurement ($\bar{\omega}$–2θ measurement) was performed on the (11-20) plane. FIG. 5A is a view showing a measurement result of an x-ray diffraction angle distribution in which clear satellite peaks are shown. According to this measurement, the In composition of the InGaN well layer was approximately 30%. On the p-type GaN layer of this epitaxial wafer, a semi-transparent p electrode having a 400 μm square (as an electrode area, for example, $1.6 \times 10^{-3}$ cm$^2$) was formed using an appropriate metal material, and an n electrode was also formed on a back surface of the GaN substrate. Accordingly, the LED element was formed.

Figure 6:
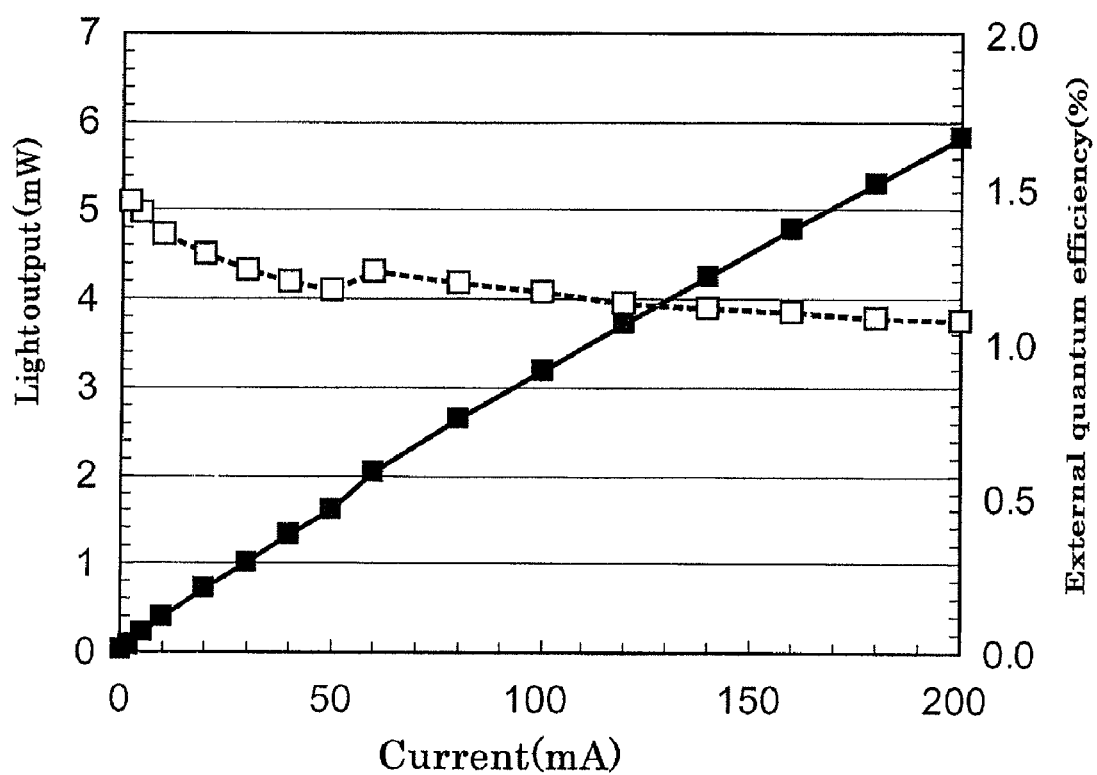
FIG. 6 is a view showing current-light output characteristics and current-external quantum efficiency characteristics.
Figure 7:
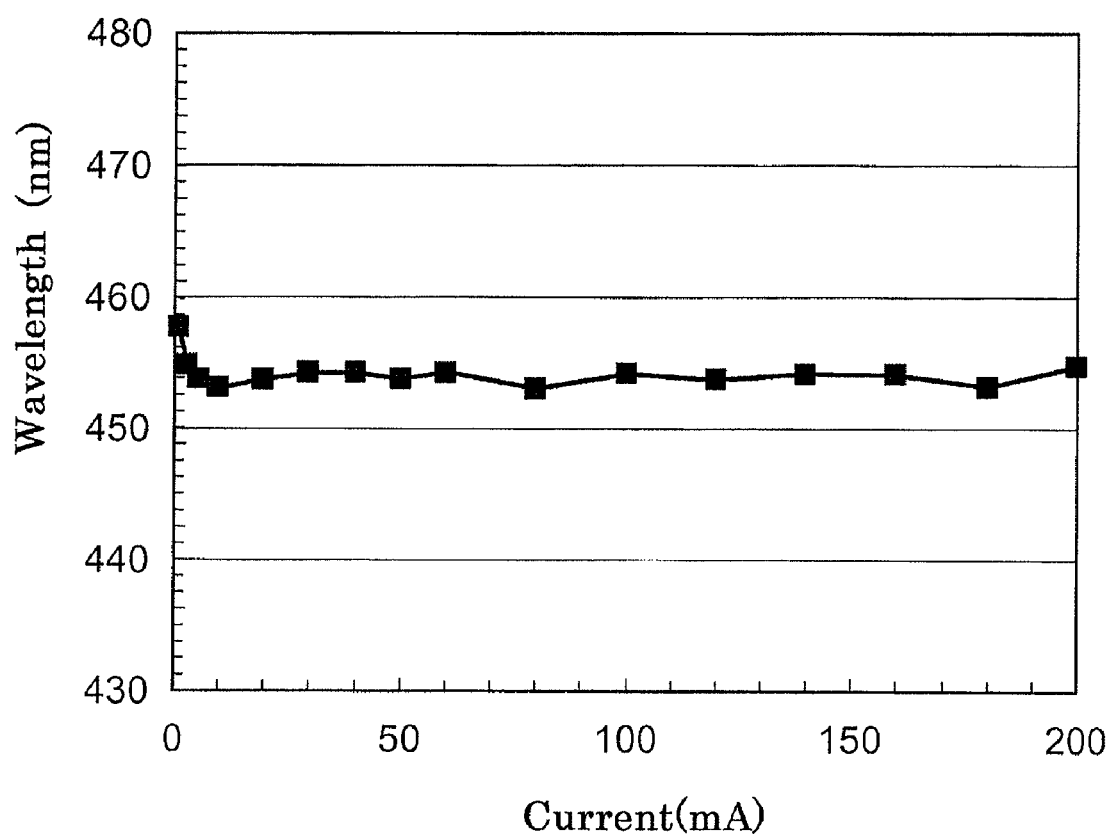
FIG. 7 is a view showing the relationship between applied current and peak light emission wavelength of a bare chip LED at room temperature.

FIG. 6 is a view showing current-light output characteristics and current-external quantum efficiency characteristics. FIG. 7 is a view showing the relationship between applied current and peak light emission wavelength of this bare chip LED at room temperature. The peak light emission wavelength was 453 nm and pure blue. At a current of 20 mA (current density: 12.5 A/cm$^2$), the light output was 0.70 mW and the external quantum effect was 1.3%. At a current of 200 mA (current density: 125 A/cm$^2$), the light output was 5.8 mW and the external quantum effect was 1.1%. This chip was molded with an epoxy resin to form an LED lamp. By measurement after the mold encapsulation, at a current of 20 mA (current density: 12.5 A/cm$^2$), the peak wavelength was 453 nm, the light output was 2.1 mW, and the external quantum effect was 3.9%. When the applied current was increased from 1 mA to 50 mA, the shift of the light emission wavelength to a shorter wavelength (blue shift) was small, such as 4 nm.

In this LED, the first conduction type gallium nitride-based semiconductor film, the active layer, and the second conduction type gallium nitride-based semiconductor film are mounted on the primary surface of the GaN substrate and are provided in that order in a predetermined axis direction. A well semiconductor layer composed of hexagonal $In_XG_{1-X}N$ ($0.16 \leq X \leq 0.35$, X: strained composition) and having a first gallium composition was grown at a first temperature $T_W$, and a barrier semiconductor layer composed of hexagonal $In_YGa_{1-Y}N$ ($0 \leq Y \leq 0.05$, Y<X, Y: strained composition) and having a second gallium composition was also grown at a second temperature $T_B$. The first gallium composition is lower than the second gallium composition, the first temperature $T_W$ is lower than the second temperature $T_B$, and the difference between the first temperature $T_W$ and the second temperature $T_B$ is 105° C. or more. According to this method, in the formation of the active layer in which the a-plane of the hexagonal $In_XGa_{1-X}N$ is aligned in the predetermined axis direction, since the difference in growth temperature between the two types of gallium nitride-based semiconductors which have the different first and second gallium compositions is 105° C. or more, a first semiconductor layer can be used as the well layer by increasing the indium composition thereof. The growth temperature range of the InGaN well layer is preferably 700° C. or more and 800° C. or less. In addition, the growth temperature range of the barrier layer is preferably 800° C. or more and 900° C. or less. Furthermore, the difference between the first temperature $T_W$ and the second temperature $T_B$ is preferably 150° C. or less.

Figure 8:
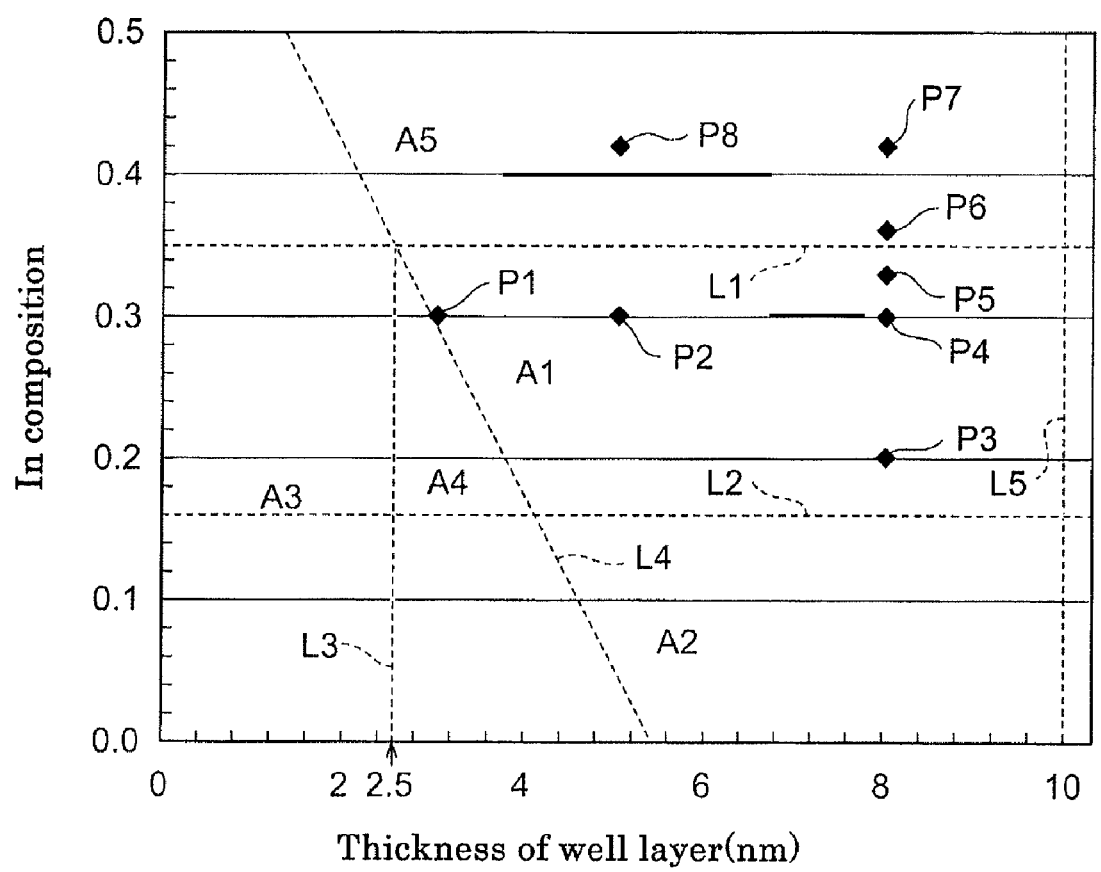
FIG. 8 is a view showing the relationship between the thickness of a well layer and an indium composition for an active layer provided to emit light having a wavelength in the range of 440 to 550 nm.

FIG. 8 is a view showing the relationship between the thickness of the well layer and the indium composition for an active layer provided to emit light having a wavelength in the range of 440 to 550 nm. The vertical axis indicates the indium composition, and the horizontal axis indicates the thickness of the well layer. An active layer in region "A1" can emit light having a wavelength in the range of 440 to 550 nm. In region "A2", since the indium composition is too low, the active layer cannot emit light having a wavelength of 440 nm or more. In region "A3", since the thickness of the well layer is too small, the active layer cannot emit light having a wavelength of 440 nm or more. In region "A4", due to the relationship between the indium composition and the thickness of the well layer, the active layer cannot emit light having a wavelength of 440 nm or more. In region "A5", since the indium composition is too high, an InGaN crystal having good quality cannot be obtained. In FIG. 8, Line L1 indicates X=0.35,
Line L2 indicates X=0.16,
Line L3 indicates D=2.5,
Line L4 indicates X$\geq$−0.1×D+0.6, and
Line L5 indicates D=10.

In addition, points P1 to P5, which are parts of the measurement results, indicate measurement points at light emission wavelengths of 441, 457, 446, 490, and 502 nm, respectively. In a region (including boundaries) surrounded by the Lines L1 to L5 is a preferable region for the relationship between the thickness of the well layer and the indium composition for an active layer provided so as to emit light having a wavelength in the range of 440 to 550 nm. At points P5 to P8, since the color of InGaN was turned to black, the light emission wavelength could not be measured.

Figure 5B:
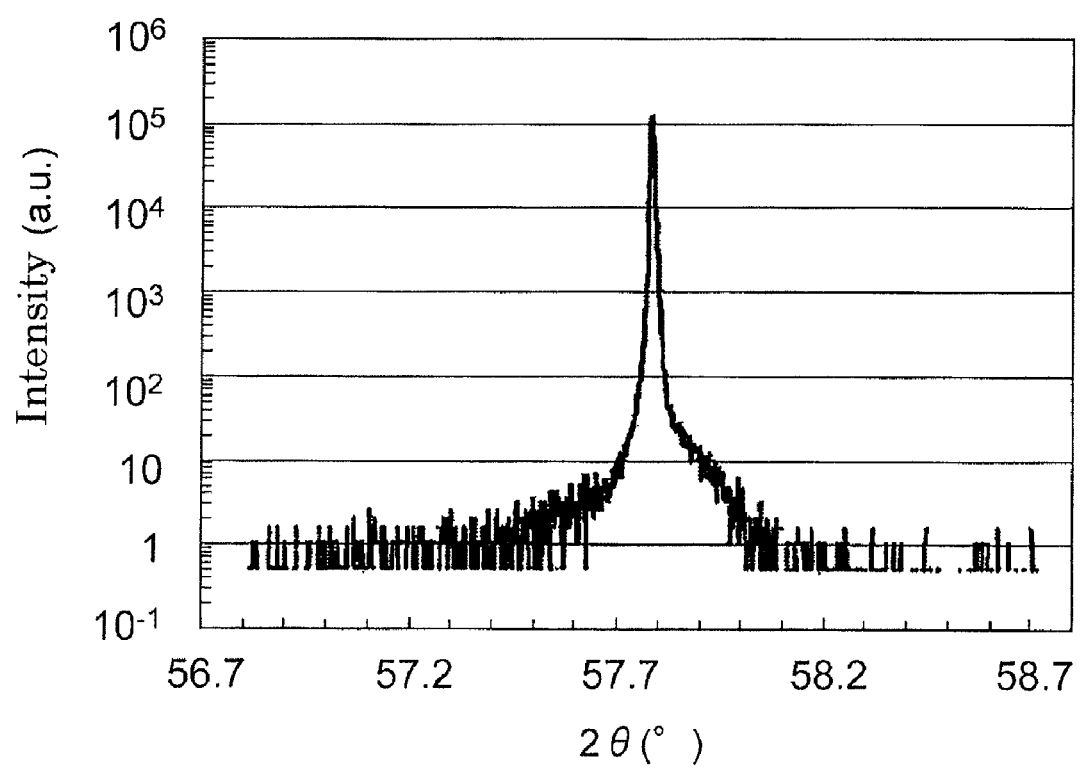
FIG. 5B is a view showing an x-ray diffraction measurement ($\overline{\omega}$–2θ measurement) result of the (11-20) plane in which no satellite peaks are shown.

As can be understood from FIG. 8, an increase of indium is not easily performed. Under conditions similar to those of the example 1 except that the growth of the InGaN well layer was performed at a substrate temperature of 730° C., an epitaxial wafer for LED was formed. The appearance of this epitaxial wafer was black, and a photoluminescent spectrum from a quantum well light emitting layer could not be observed. FIG. 5B is a view showing an x-ray diffraction measurement ($\omega$–2$\theta$ measurement) result of the (11-20) plane of this epitaxial wafer. The satellite peaks of the quantum well light emitting layer were not observed at all. Hence, the quantum well structure was not formed. It is estimated that the indium composition was more 35%. As described above, when the indium composition is increased in the InGaN growth, the crystalline quality is seriously degraded.

In addition, under conditions similar to those of the example 1 except that the growth of the InGaN well layer was performed by supplying trimethylindium at a flow rate of 58 μmol/minute, an epitaxial wafer for LED was formed. The appearance of this epitaxial wafer was black, and a photoluminescent spectrum from a quantum well light emitting layer could not be observed. In an x-ray diffraction measurement ($\omega$–2$\theta$ measurement) result of the (11-20) plane of this epitaxial wafer, the satellite peaks of the quantum well light emitting layer were not observed at all. Hence, the quantum well structure was not formed. It is estimated that the indium composition was more than 35%. Hence, it is also understood from this result that when the indium composition is increased, the crystalline quality is seriously degraded.

Hence, in order to form a light emitting device using the a-plane, it is important to increase the difference in growth temperature between the well layer and the barrier layer as well as the control of the thickness and the indium composition of the well layer.

(Thickness of Well Layer)

Figure 9:
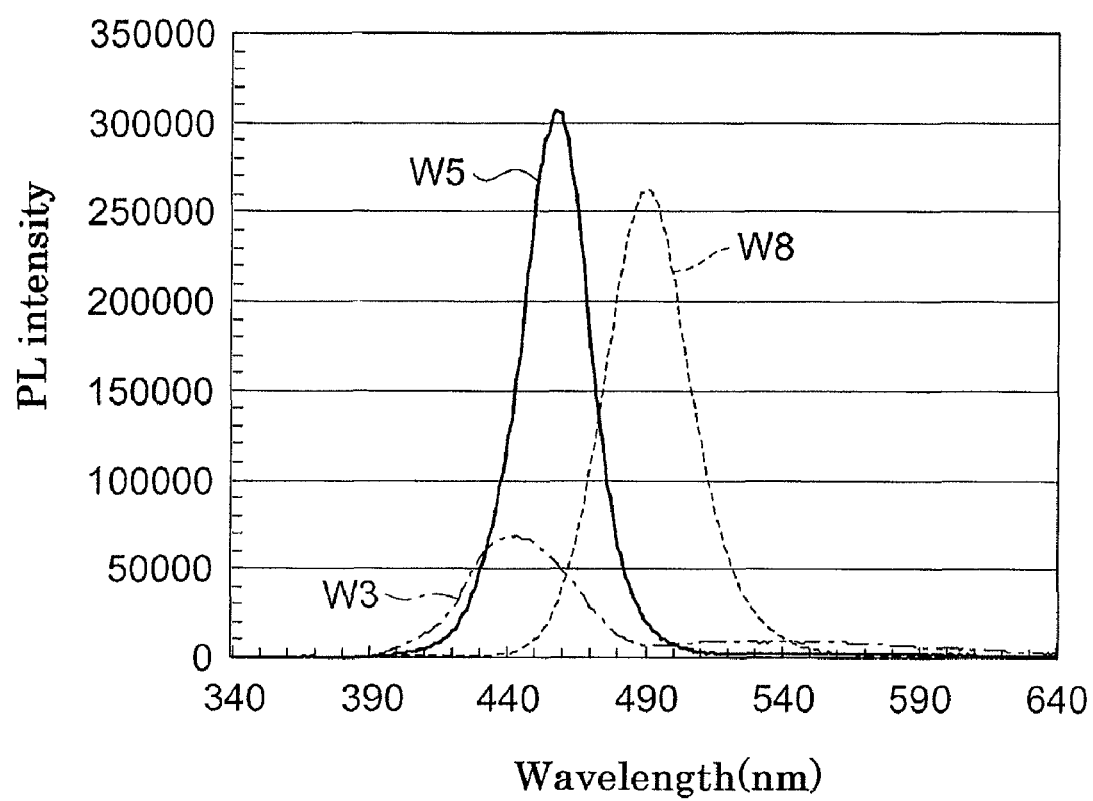
FIG. 9 is a view showing the relationship between the thickness of a well layer and a PL spectrum.

Another example will be described. Under conditions similar to those of the example 1, epitaxial wafers for an LED structure were formed by changing the thickness of the InGaN well layer to 3, 5, and 8 mm. FIG. 9 shows the relationship between the thickness of the well layer and PL spectra W3, W5, and W8. As the thickness of the well layer is increased, the PL wavelength is increased. As shown in FIG. 9, the PL wavelength is 441 nm at a well width of 3 nm, the PL wavelength is 457 nm at a well width of 5 nm, and the PL wavelength is 490 nm at a well width of 8 nm.

An LED having a well width of 8 nm was formed using an epitaxial wafer in a manner similar to that in the example 1. For example, by measurement of a bare chip, the peak light emission wavelength was 489 nm. At a current of 20 mA (current density: 12.5 A/cm$^2$), the light output was 0.5 mW, and the external quantum efficiency was 0.78%. This chip was molded with an epoxy resin, so that an LED lamp was formed. By the measurement performed after the mold encapsulation, at a current of 20 mA (current density: 12.5 A/cm$^2$), the peak wavelength was 489 nm, the light output was 1.5 mW, and the external quantum efficiency was 2.8%.

(Laser Diode)

Still another example will be described. A laser diode including an active layer provided so as to emit light having a wavelength in the range of 440 to 550 nm was formed as described below. A substrate composed of a hexagonal Al$_Z$Ga$_{1-Z}$N (0≦Z≦1) having an a-plane primary surface was prepared. In this example, after a freestanding GaN body was formed by slicing an n-type GaN crystal which included, at the c-plane, low defect regions each having a threading dislocation density of 1×10$^6$ cm$^{-2}$ or less and defect concentrated regions distributed in a stripe pattern and which was grown in the (0001) direction, this freestanding GaN body was polished, so that an a-plane GaN (11-20) substrate was formed.

Prior to the epitaxial growth of the first conduction type gallium nitride-based semiconductor, as in the case of the formation of LED, a heat treatment is performed on the a-plane GaN substrate while gas including ammonia and hydrogen is supplied. By this heat treatment, a flat substrate surface can be easily obtained, and a semiconductor light emitting device having more superior light emission properties can be obtained.

A first n-type Al$_{0.03}$Ga$_{0.97}$N film was grown on the a-plane primary surface of the GaN layer. The substrate temperature for this Al$_{0.03}$Ga$_{0.97}$N is 1,150° C., and the thickness of the AlGaN film is, for example, 2 μm. Hydrogen was primarily used as a carrier gas, and trimethylgallium (99 μmole/minute), trimethylaluminum (46 μmole/minute), ammonia (0.27 mole/minute), and monosilane were supplied in a growth reactor. Subsequently, a second n-type Al$_{0.07}$Ga$_{0.93}$N film was grown on the first n-type Al$_{0.03}$Ga$_{0.97}$N film. The thickness of the AlGaN film is, for example, 600 nm. Hydrogen was primarily used as a carrier gas, and trimethylgallium (37 μmole/minute), trimethylaluminum (3.0 μmole/minute), ammonia (0.27 mole/minute), and monosilane were supplied in a growth reactor.

Next, after the growth was once stopped, an n-type GaN layer was grown while the substrate temperature was maintained at 1,150° C. For this growth, hydrogen was primarily used as a carrier gas, and trimethylgallium (99 μmole/minute), ammonia (0.22 mole/minute), and monosilane were supplied. The thickness of the GaN film is, for example, 3 nm.

Subsequently, an active layer is formed on the n-type gallium nitride-based semiconductor film so as to emit light having a wavelength in the range of 440 to 550 nm. For this formation, after the growth was once stopped, and the substrate temperature was decreased to 880° C., an In$_{0.01}$Ga$_{0.99}$N barrier layer was formed. The thickness of this barrier layer is, for example, 15 nm. For this growth, nitrogen was primarily used as a carrier gas, and trimethylgallium (24 μmole/minute), trimethylindium (1.6 μmole/minute), and ammonia (0.27 mole/minute) were supplied. After the InGaN barrier layer was grown, and the substrate temperature was decreased to 750° C., an In$_{0.27}$Ga$_{0.73}$N well was then grown. The thickness of this well layer is, for example, 8 nm. For this growth, nitrogen was primarily used as a carrier gas, and trimethylgallium (24 μmole/minute), trimethylindium (24 μmole/minute), and ammonia (0.36 mole/minute) were supplied. By repeating the growth of the undoped barrier layer and that of the undoped well layer, for example, a 3-period quantum well layer was formed.

Next, a gallium nitride-based semiconductor film was formed on the active layer. First, an undoped GaN light guiding layer was grown. The substrate temperature for this GaN is 1,100° C., and the thickness thereof is, for example, 100 nm. Hydrogen was primarily used as a carrier gas, and trimethylgallium (99 μmole/minute) and ammonia (0.22 mole/minute) were supplied in a growth reactor.

second conduction type gallium nitride-based semiconductor film was formed on the light guiding layer. For this formation, after the growth was again once stopped, and the substrate temperature was increased to 1,050° C., a p-type Al$_{0.18}$Ga$_{0.82}$N electron blocking layer was grown. For this growth, hydrogen was primarily used as a carrier gas, trimethylgallium (17 μmole/minute), trimethylaluminum (2.8 μmole/minute), ammonia (0.22 mole/minute), and cyclopentadienyl magnesium were supplied. The thickness of the electron blocking layer is, for example, 20 nm.

After the electron blocking layer was formed, a p-type Al$_{0.07}$Ga$_{0.93}$N cladding layer was formed. This growth was performed at a substrate temperature of 1,050° C. For this growth, hydrogen was primarily used as a carrier gas, trimethylgallium (24 μmole/minute), trimethylaluminum (2.0 μmole/minute), ammonia (0.22 mole/minute), and cyclopentadienyl magnesium were supplied. The thickness of the cladding layer is, for example, 400 nm.

After the p-type AlGaN cladding layer was grown, a p-type GaN contact layer was grown. For this growth, hydrogen was primarily used as a carrier gas, trimethylgallium (67 μmole/minute), ammonia (0.22 mole/minute), and cyclopentadienyl magnesium were supplied. The thickness of the GaN layer is, for example, 50 nm.

By the steps described above, the epitaxial wafer for this laser diode (LD) was formed. The a-plane of each gallium nitride-based semiconductor film of the epitaxial wafer is substantially parallel to a plane surface extending along the primary surface of the GaN substrate, and the a-plane of the active layer intersects an axis perpendicular to the primary surface of the substrate.

Figure 10:
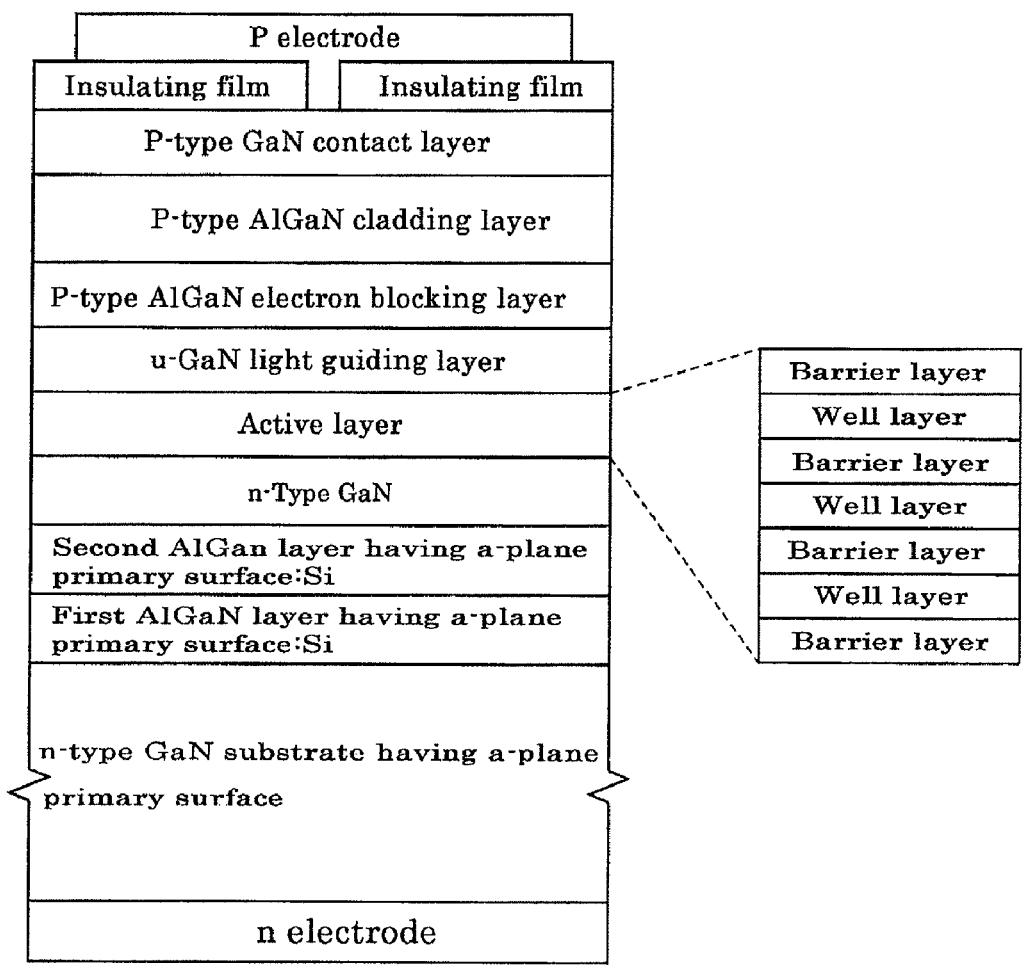
FIG. 10 is a view schematically showing a nitride laser diode according to an example.

Subsequently, the epitaxial wafer was taken out from a reactor. After an insulating film (such as a silicon oxide film) was formed on the p-type contact layer, a window having a width of 10 μm was formed by photolithography and etching, and a p-type electrode composed, for example, of Ni/Au was formed. After the thickness of the GaN substrate was decreased by polishing or the like, an n electrode was formed on the back surface of the substrate. By cleavage at the m-plane, a laser bar having a length of 800 μm was formed. The cleaved surface functions as a facet mirror. An LD element having the structure shown in FIG. 10 was formed. When a pulse current was applied to this LD element at room temperature, laser oscillation at a wavelength of 490 nm was observed.

(Substrate Different from GaN Substrate)

An LED was formed using a substrate different from a GaN substrate. Under conditions similar to those of the example 1, an LED was formed by growing an LED epitaxial structure on a 4H—SiC (11-20) substrate or an r-plane sapphire substrate instead of the n-type a-plane GaN (11-20) substrate. Many stacking faults were generated, and a very weak output could only be obtained.

(c-plane GaN Substrate)

In addition, an LED was formed using a c-plane GaN substrate. A blue light emitting device was formed by a metal organic chemical vapor deposition method as described below. As source materials, trimethylgallium, trimethylaluminum, trimethylindium, ammonia, monosilane, and cyclopentadienyl magnesium were used. The c-plane GaN substrate was formed by slicing n-type GaN which included low defect regions each having a threading dislocation density of less than $1 \times 10^6$ cm$^{-2}$ and defect concentrated regions distributed in a stripe pattern and which was grown in the (0001) direction, followed by polishing.

The n-type c-plane GaN (0001) substrate was placed on a susceptor, and ammonia and hydrogen were supplied in a reactor while the reactor pressure was controlled at 30 kPa, so that cleaning was performed at a substrate temperature of 1,050° C. for 10 minutes. Subsequently, after the substrate temperature was increased to 1,100° C., hydrogen was primarily used as a carrier gas, and trimethylgallium (24 μmole/minute), trimethylaluminum (4.3 μmole/minute), ammonia (0.22 mole/minute), and monosilane were supplied, so that an n-type $Al_{0.12}Ga_{0.88}N$ layer having thickness of 50 nm was grown. Next, after the growth was once stopped, and the substrate temperature was increased to 1,150° C., hydrogen was primarily used as a carrier gas, and trimethylgallium (244 μmole/minute), ammonia (0.33 mole/minute), and monosilane were supplied, so that an n-type GaN layer having a thickness of 2 μm was grown.

Subsequently, after the growth was once stopped, the substrate temperature was decreased to 880° C., nitrogen was primarily used as a carrier gas, and trimethylgallium (24 μmole/minute), trimethylindium (1.6 μmole/minute), and ammonia (0.27 mole/minute) were supplied, so that an InGaN barrier layer (In composition: 1%) having a thickness of 15 nm was grown. Next, after the substrate temperature was decreased to 800° C., nitrogen was primarily used as a carrier gas, and trimethylgallium (16 μmole/minute), trimethylindium (13 μmole/minute), and ammonia (0.36 mole/minute) were supplied, so that an InGaN well layer having a thickness of 3 nm was grown. By repeating the steps described above, a 6-period quantum well light emitting layer was formed.

Subsequently, after the growth was again once stopped, and the substrate temperature was increased to 1,050° C., hydrogen was primarily used as a carrier gas, and trimethylgallium (17 μmole/minute), trimethylaluminum (2.8 μmole/minute), ammonia (0.22 mole/minute), and cyclopentadienyl magnesium were supplied, so that a p-type $Al_{0.18}Ga_{0.82}N$ electron blocking layer having a thickness of 20 nm was grown. Next, hydrogen was primarily used as a carrier gas, and trimethylgallium (99 μmole/minute), ammonia (0.22 mole/minute), and cyclopentadienyl magnesium were supplied, so that a p-type GaN layer having a thickness of 25 nm was grown. Next, hydrogen was primarily used as a carrier gas, and trimethylgallium (67 μmole/minute), ammonia (0.22 mole/minute), and cyclopentadienyl magnesium were supplied, so that a p-type GaN contact layer having a thickness of 25 nm was grown.

Figure 11A:
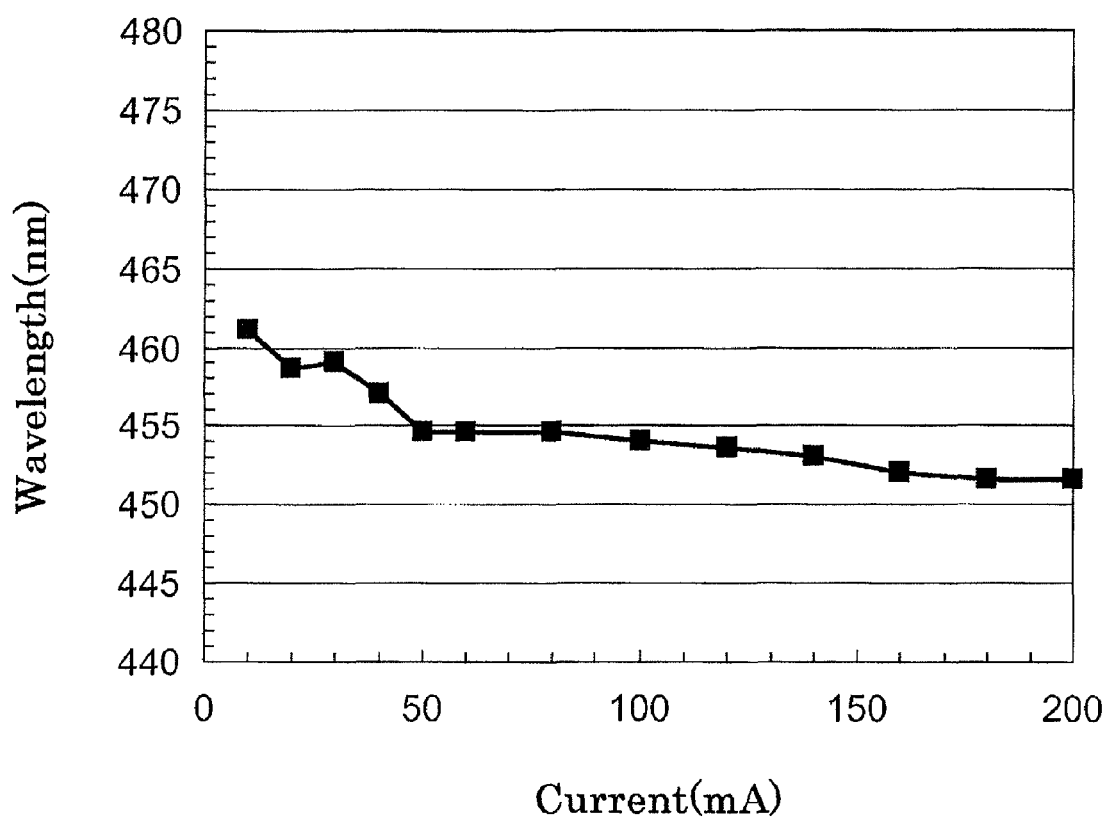
FIG. 11A is a view showing a blue shift of light emission wavelength with an increase in current in an LED formed on a c-plane substrate.

Next, the GaN substrate was taken out from a reactor, and when x-ray diffraction measurement ($\overline{\omega}$–2θ measurement) was performed, the indium composition of the InGaN well layer was approximately 10%. A semi-transparent p electrode composed of an appropriate metal material and having a size of 400 μm square (electrode area: $1.6 \times 10^{-3}$ cm$^2$) was formed on the p-type GaN layer of this LED epitaxial wafer, and an n electrode was formed on the rear surface of the GaN substrate, so that an LED element was formed. When a pulse current was applied to this bare chip LED at room temperature, although a high light emission efficiency was obtained at a wavelength of 460 nm of pure blue color, a blue shift of light emission wavelength with an increase in current was observed as shown in FIG. 11A. On the other hand, in the LED of the example 1, a blue shift of light emission wavelength with an increase in current was not observed.

Figure 11B:
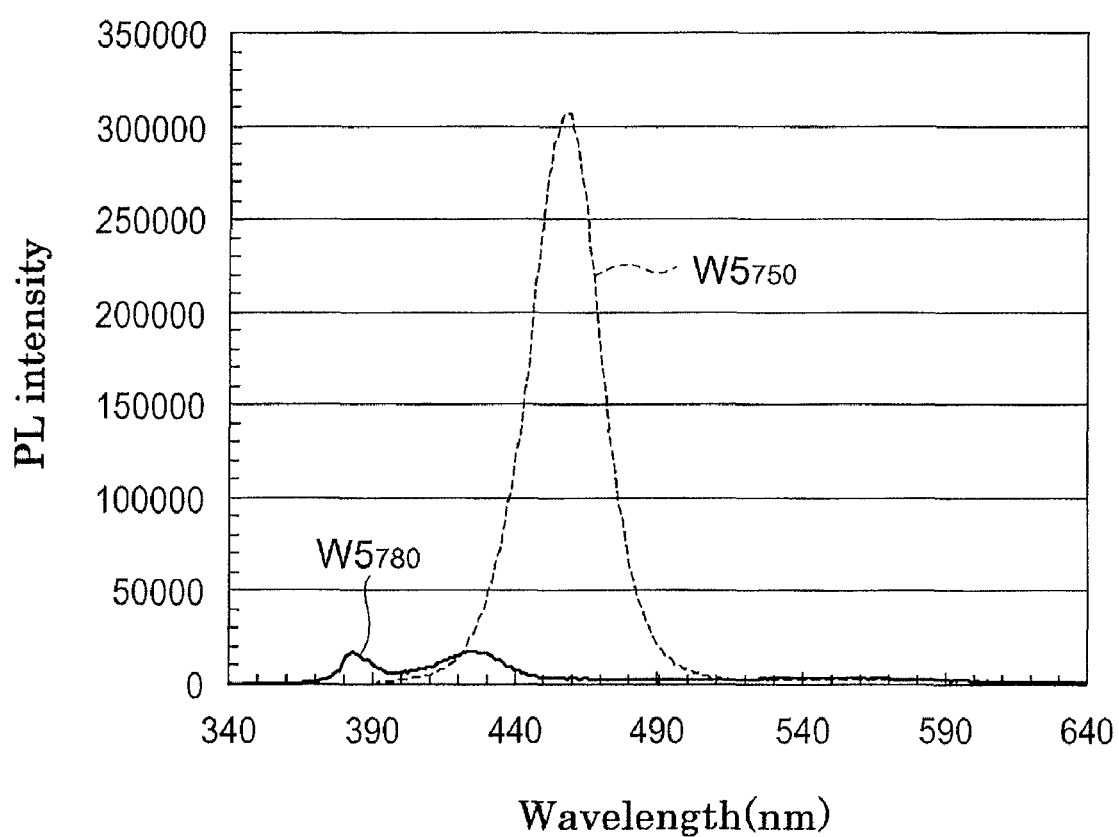
FIG. 11B is a view showing a PL spectrum of an active layer formed on a-plane GaN at a high temperature.

Furthermore, in the example 1, the $In_{0.01}Ga_{0.99}N$ barrier layer was grown at 880° C., and the $In_{0.27}Ga_{0.73}N$ well layer (thickness: 5 nm) was also grown at a substrate temperature of 750° C. On the other hand, when the InGaN barrier layer was formed at 880° C., and the InGaN well layer (thickness: 5 nm) was also formed at a substrate temperature of 780° C. (temperature difference: 100° C.) which was higher than 750° C., as shown in FIG. 11B, two peaks having wavelengths of 385 nm and 425 nm were observed in the PL spectrum (reference numeral "$W5_{780}$"). The peak value of the PL spectrum indicated by the reference numeral $W5_{780}$ is low as compared to the peak value of the PL spectrum indicated by reference numeral $W5_{750}$. According to the x-ray diffraction measurement ($\overline{\omega}$–2θ measurement) of the (11-20) plane, the indium composition of the InGaN well layer grown at a substrate temperature of 780° C. was 7%.

Although the principle of the present invention has been illustrate with reference to the preferable embodiments, it is to be understood by a person skilled in the art that the configurations and the details of the present invention may be modified and changed without departing from the principle thereof. In the embodiments of the present invention, for example, the light emitting device, such as a light emitting diode or a laser diode, has been described; however, the present invention is not limited to the specific configuration disclosed in the embodiments. In addition, in the embodiments of the present invention, although the light emitting device on the a-plane GaN substrate has been described by way of example, a light emitting device on an a-plane AlGaN substrate may also be formed. Hence, the rights in the scope of the patent claims, and in all modifications and alterations deriving from the spirit and scope thereof, are claimed.

The invention claimed is:

1. A nitride semiconductor light emitting device comprising:
    a first conduction type gallium nitride-based semiconductor region;
    a second conduction type gallium nitride-based semiconductor region; and
    an active layer which is provided between the first conduction type gallium nitride-based semiconductor region and the second conduction type gallium nitride-based semiconductor region so as to emit light having a wavelength in the range of 440 to 550 nm,
    wherein the active layer includes a well layer composed of hexagonal $In_xGa_{1-x}N$ ($0.16 \leq X \leq 0.35$, the indium composition X: strained composition),
    a thickness D of the well layer is more than 2.5 nm,
    the thickness D of the well layer is 10 nm or less,
    the indium composition X and the thickness D satisfy $X \geq -0.1 \times D + 0.6$,
    the first conduction type gallium nitride-based semiconductor region, the active layer, and the second conduction type gallium nitride-based semiconductor region are disposed in a predetermined axis direction,
    the a-plane of the hexagonal $In_xGa_{1-x}N$ is aligned in the predetermined axis direction,
    further comprising an n-type freestanding substrate composed of a hexagonal $Al_zGa_{1-z}N$ semiconductor ($0 \leq Z \leq 1$),
    wherein the first conduction type gallium nitride-based semiconductor region, the active layer, and the second conduction type gallium nitride-based semiconductor region are mounted on a primary surface of the substrate, and
    an n-electrode located on the back surface of the substrate.

2. The nitride semiconductor light emitting device according to claim 1, wherein the active layer includes a barrier layer composed of hexagonal $In_yGa_{1-y}N$ ($0 \leq Y \leq 0.05$, Y: strained composition).

3. The nitride semiconductor light emitting device according to claim 1, wherein the primary surface of the substrate is off-oriented from the a-plane by an off angle) ($-2° \leq \theta \leq +2°$).

4. The nitride semiconductor light emitting device according to claim 1, wherein threading dislocations of the substrate extend in the c-axis direction, and the density of threading dislocations intersecting the c-plane of the substrate is $1 \times 10^7$ $cm^{-2}$ or less.

5. The nitride semiconductor light emitting device according to claim 1, wherein the substrate includes a first region having a density of threading dislocations extending in the c-axis direction higher than a first threading dislocation density and a second region having a density of threading dislocations extending in the c-axis direction lower than the first threading dislocation density, and the second region appears on the primary surface of the substrate.

6. The nitride semiconductor light emitting device according to claim 5, wherein the density of threading dislocations in the second region is less than $1 \times 10^7$ $cm^{-2}$.

7. A method for forming a nitride semiconductor light emitting device comprising:
    a step of preparing an n-type freestanding substrate composed of a hexagonal $Al_zGa_{1-z}N$ semiconductor ($0 \leq Z \leq 1$);
    a step of forming a first conduction type gallium nitride-based semiconductor film on a primary surface of the substrate;
    a step of forming an active layer which emits light having a wavelength in the range of 440 to 550 nm on the first conductive type gallium nitride-based semiconductor film;
    a step of forming a second conduction type gallium nitride-based semiconductor film on the active layer; and
    a step of forming an n-electrode on the back surface of the substrate,
    wherein the first conduction type gallium nitride-based semiconductor film, the active layer, and the second conduction type gallium nitride-based semiconductor film are disposed on the primary surface of the substrate in a predetermined axis direction,
    in the step of forming the active layer, a first semiconductor layer composed of hexagonal $In_xGa_{1-x}N$ ($0.16 \leq X \leq 0.35$, X: strained composition) and having a first gallium composition is grown at a first temperature,
    in the step of forming the active layer, a second semiconductor layer composed of hexagonal $In_yGa_{1-y}N$ ($0 \leq Y \leq 0.05$, $Y<X$, Y: strained composition) and having a second gallium composition is grown at a second temperature,
    the first gallium composition is lower than the second gallium composition,
    the first temperature is lower than the second temperature,
    the difference between the first temperature and the second temperature is 105° C. or more, and
    the a-plane of the hexagonal $In_xGa_{1-x}N$ is aligned in the predetermined axis direction.

8. The method according to claim 7, wherein the substrate is obtained by cutting a hexagonal $Al_zGa_{1-z}N$ ($0 \leq Z \leq 1$) crystal grown in the c-axis direction so as to intersect the a-axis thereof, and the primary surface of the substrate is processed by a polishing treatment and extends along a plane intersecting the a-axis.

9. The method according to claim 7, wherein the primary surface of the substrate is off-oriented from the a-plane by an off-angle) ($-2° \leq \theta \leq +2°$).

10. The method according to claim 7, further comprising the step of: before the first conduction type gallium nitride-based semiconductor film is formed, performing a heat treatment of the substrate while gas containing ammonia and hydrogen is supplied.

11. The method according to claim 7, wherein the substrate includes a plurality of first regions in each of which the density of threading dislocations extending in the c-axis direction is higher than a first threading dislocation density and a plurality of second regions in each of which the density of threading dislocations extending in the c-axis direction is lower than the first threading dislocation density,
    the first regions and the second regions are alternately disposed, and
    one of the second regions appears on the primary surface of the substrate.

12. The method according to claim 11, wherein the density of threading dislocations of each of the second regions is less than $1 \times 10^7$ $cm^{-2}$.

* * * * *